United States Patent [19]

Redmon

[11] Patent Number: 4,481,700
[45] Date of Patent: Nov. 13, 1984

[54] PANEL PUNCH

[76] Inventor: Larry Redmon, 11625 Woodstone Pl., Fort Wayne, Ind. 46825

[21] Appl. No.: 424,892

[22] Filed: Sep. 28, 1982

[51] Int. Cl.$^3$ .......................... B23Q 17/00; B26F 1/00
[52] U.S. Cl. ......................................... 29/407; 30/360
[58] Field of Search ................. 30/360, 361, 358, 359; 33/DIG. 10; 29/407, 558; 83/123, 55

[56] References Cited

U.S. PATENT DOCUMENTS

| 1,817,223 | 8/1931 | Abramson et al. | 30/360 |
| 2,096,778 | 10/1937 | Azer | 30/360 |
| 2,221,904 | 11/1940 | Abramson et al. | 30/360 |
| 2,643,721 | 6/1953 | Arbuckle | 83/123 |
| 3,063,319 | 11/1962 | Johnson . | |
| 3,269,011 | 8/1966 | Herrstrum | 30/360 |
| 3,391,460 | 11/1966 | Moore . | |
| 3,494,033 | 2/1970 | Bosco et al. | 30/360 |
| 3,594,904 | 7/1971 | Wright . | |
| 3,768,351 | 10/1973 | Stepan | 83/55 |
| 4,087,913 | 5/1978 | Jackson . | |

FOREIGN PATENT DOCUMENTS 851760 1/1940 France ................................. 30/360
1415620 11/1975 United Kingdom ................. 30/360

Primary Examiner—Howard N. Goldberg
Assistant Examiner—Steven Nichols
Attorney, Agent, or Firm—Jeffers, Irish & Hoffman

[57] ABSTRACT

A method and apparatus for cutting a hole with at most one line of symmetry in, for example, a sheet metal panel is disclosed wherein a plurality of holes are first drilled in the panel and thereafter a punch is positioned on one side of the panel and a die on the other side which are threadedly coupled together by a plurality of bolts passing through the panel holes so that tightening one or more of the bolts will draw the punch and die toward one another forming the desired hole. Typically, a central one of three bolts is tightened to perform the cutting operation while the remaining two are primarily for punch and die alignment purposes but may also be tightened to compensate for misalignment or when cutting a particularly heavy gauge sheet metal panel. Additional threaded holes in the die may be provided for threadedly ejecting a slug cut from a panel and additional punch supported pointed screws for center-punching the panel for a subsequent drilling operation may also be included.

19 Claims, 6 Drawing Figures

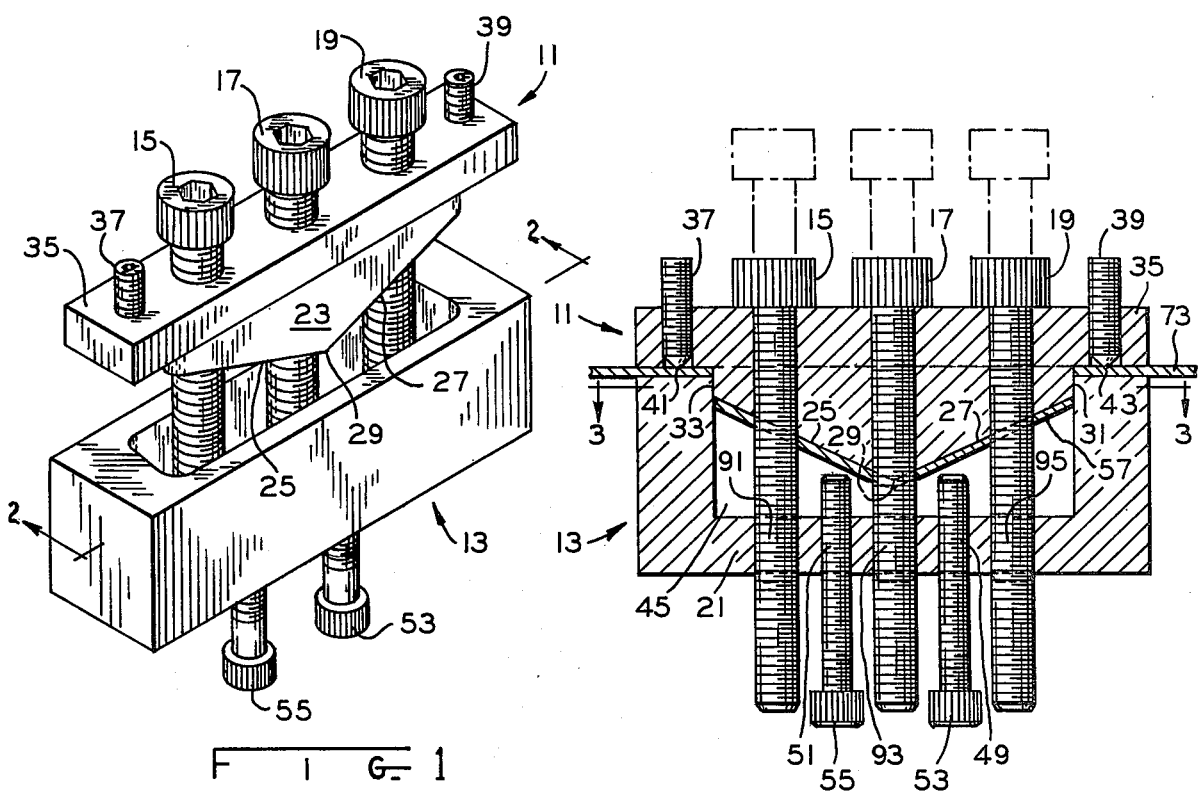
FIG. 1
FIG. 2
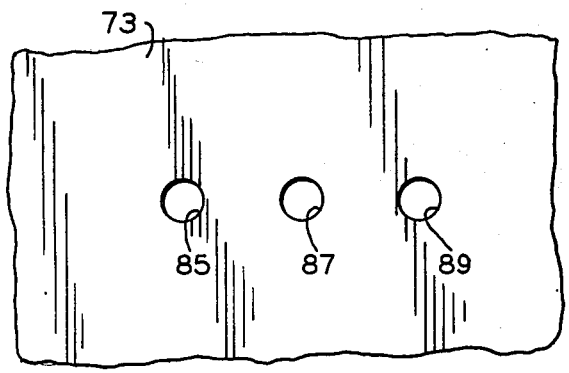
FIG. 4
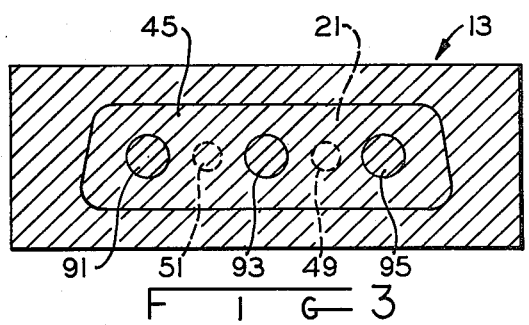
FIG. 3
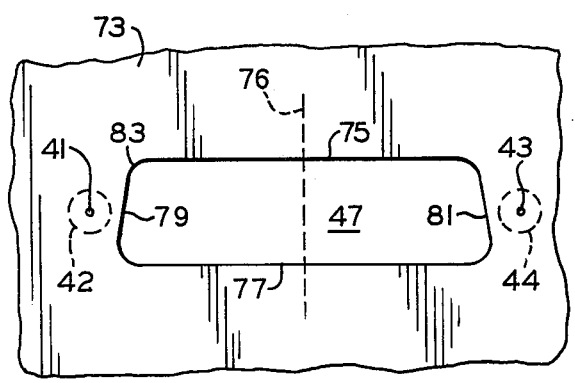
FIG. 5
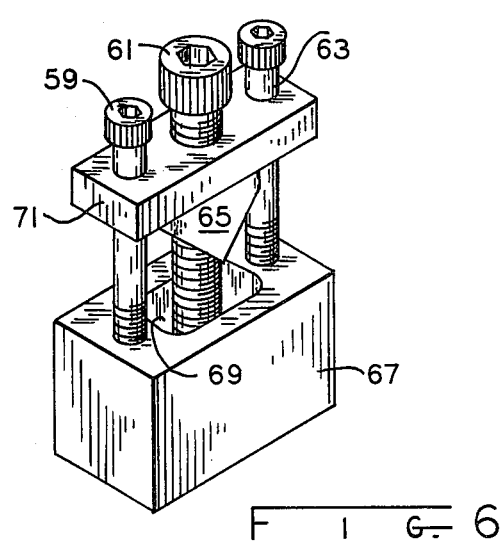
FIG. 6

PANEL PUNCH

BACKGROUND OF THE INVENTION

The present invention relates generally to draw punch cutters and more particularly to such cutters and their use for providing holes in panels to receive electrical components.

Mounting holes are currently provided in panels, such as electronic equipment chassis or front panels, by the commonplace drilling of circular mounting holes. When irregular or noncircular holes are desired in mass produced items, such holes are punched during the forming of the front panel or chassis, but in small scale production or equipment modification, the placement of such noncircular holes generally requires the drilling of several holes followed by hand sawing and filing to remove the desired material from the panel. Such a technique is clearly time-consuming and frequently results in an irregular, unsightly panel hole.

Draw punch cutters have been used to a limited extent in forming noncircular holes such as square holes and D-shaped holes which are circular save for one flat chordal surface as might be used for mounting toggle switches, potentiometers and the like. The holes which may be formed by these commercially available cutters are limited to those having a high degree of symmetry or regularity since such cutters employ a nut and bolt with the bolt shaft being slotted and with the mating punch and die having alignment keys which engage the bolt slot to maintain proper alignment between the punch and the die, and of course, the single bolt is merely tightened to achieve the cutting operation. Such known commercial draw punch cutters are not suitable for forming holes which are substantially elongated or which otherwise lack a high degree of symmetry since proper alignment, as well as uniformly distributed cutting pressures, are quite difficult to achieve.

A family of electrical connectors, referred to as "D sub-minatures", has recently become popular which require a panel opening of a generally trapezoidal shape having respective corner fillets and, depending upon the number of pins in the connector, of a substantially elongated configuration. With this type connector, either the receptacle or the plug may be mounted in the same hole configuration and, typically, a pair of mounting screws positioned adjacent the tapering edges of the trapezoid are employed. Mounting of such D sub-minature connectors in an existing panel has until now been by the drill, saw and file technique described above.

SUMMARY OF THE INVENTION

Among the several objects of the present invention may be noted the provision of a small convenient tool which a workman may carry along with his normal complement of tools for providing D sub-minature openings in panels; the provision of a method of cutting a hole of a comparatively long narrow configuration in a panel; the method of cutting a hole in a panel wherein the hole has at most one line of symmetry; the provision of a draw punch cutter employing a plurality of generally parallel bolts for maintaining punch and die alignment, as well as effecting the actual cutting process; the provision of a draw punch cutter which also marks the location of additional holes to be subsequently drilled; the provision of a draw punch cutter where both the punch and die members thereof are readily resharpened; and the provision of a method and apparatus for cutting holes in panels not limited to hole configurations having symmetry about a point. These, as well as other objects and advantageous features of the present invention, will be in part apparent and in part pointed out hereinafter.

In general, in accordance with the invention, irregular or elongated holes are formed in a panel for component mounting purposes by first drilling a plurality of circular holes in that panel and then locating a punch and die on opposite sides of the panel threadedly coupled by bolts passing through respective ones of the drilled holes. Tightening of at least one of the bolts, preferably a central one, draws the punch and die toward one another to cut the hole in the panel. The remaining bolts of the plurality at least maintain alignment between the punch and die and may also be tightened if needed.

Also in general and in one form of the invention, a draw punch cutter has matable punch and die members axially movable into engagement to cut a hole in an intervening panel with the members when engaged including a plurality of pairs of parallel pairwise axially aligned holes with one of each pair being threaded to receive a bolt passing through the other of the pair for maintaining the members in alignment and for forcing the members together into engagement when one or more bolts are tightened. The punch may include a flange at one end of a columnar punch portion including panel marking members and the columnar punch portion may have a wedge-shaped pointed end readily accessible for grinding to resharpen the punch, and the die cavity may be adapted to receive bolts for slug ejection purposes.

BRIEF DESCRIPTION OF THE DRAWING

FIG. 1 is a perspective view of an assembled punch and die arrangement in separated alignment;

FIG. 2 is a view in cross-section along the line 2—2 of FIG. 1 showing the punch and die in closed, cutting relation;

FIG. 3 is a view in cross-section along the line 3—3 of FIG. 2;

FIG. 4 depicts an illustrative sheet metal panel with the preparatory holes for receiving the draw punch cutter;

FIG. 5 depicts the illustrative panel of FIG. 4 after the punching operation; and FIG. 6 is a perspective view similar to FIG. 1 and illustrating several modifications for punching holes of less severe elongation.

Corresponding reference characters indicate corresponding parts throughout the several views of the drawing.

The exemplifications set out herein illustrate a preferred embodiment of the invention in one form thereof and such exemplifications are not to be construed as limiting the scope of the disclosure or the scope of the invention in any manner.

DESCRIPTION OF THE PREFERRED EMBODIMENT

The exemplary D sub-minature connector requires a generally trapezoidal-shaped mounting hole illustrated at 47 in FIG. 5 along with a pair of mounting screw holes shown in dashed lines at 42, 44, respectively, laterally outwardly of the tapered sides of the trapezoidal opening and respectively centered at the points 41 and 43 indicated in FIG. 5. Of course, prior to mounting the connector, holes 42, 44 would be drilled in the panel for those mounting screws. To achieve the panel aperture and mounting screw marking of FIG. 5, the draw punch cutter illustrated in FIGS. 1, 2 and 3 may be used.

The draw punch cutter of FIGS. 1, 2 and 3 includes matable punch 11 and die 13 members movable along an axis in the direction of elongation of the screws or bolts 15, 17 and 19. Bolts 15, 17 and 19 pass through three generally parallel holes in the punch 11 and threadedly engage the planar bottom portion 21 of the die cavity in corresponding axially aligned threaded holes as illustrated in FIG. 2. These three bolts 15, 17 and 19 function to maintain proper alignment between the punch member 11 and die member 13 and further tightening of one or more of these bolts forces the die and punch members toward one another for hole cutting purposes. The die as depicted is designed for use on sheet metal having a thickness of, on the order of, 22 to 16 gauge metal with only the heavier gauge requiring tightening of all three bolts; with the tightening of bolt 17 frequently sufficient to cut the desired hole.

Punch 11 is seen to include a columnar punch portion 23 having a cross section corresponding to the hole depicted in FIG. 5 and terminating at the leading end thereof in a pair of planar surfaces 25 and 27 which are inclined to the axis of motion and meet along a line 29 about midway between the columnar edges 31 and 33. With this configuration on the leading edge or cutting face of the punch the two planar surfaces are readily accessible for grinding to resharpen the punch.

The punch 11 further includes a flange portion 35 at the trailing end of the punch which extends laterally beyond the columnar punch portion 23 and which threadedly receives the screws 37 and 39. As most readily seen in FIG. 2, screws 37 and 39 have pointed leading ends which, when the die is completely closed, may be advanced slightly to dimple, indent or otherwise mark the panel surface at 41 and 43 with this dimple forming the center punch for a subsequent drilling operation to form holes 42, 44 to adapt the panel to the reception of electrical component mounting screws.

The punch portion 23, die cavity 45 and the punched out area 47 of FIG. 5 are of course all of the same generally trapezoidal cross-section having somewhat rounded corners. The cross-section is uniform throughout the cavity 45 terminating in the cavity bottom portion 21 whereas on the punch this cross-section terminates with the inclined planar surfaces 25 and 27.

The cavity bottom portion 21 includes a pair of additional threaded holes 49 and 51 for receiving respectively bolts 53 and 55. Bolts 53 and 55 are for slug ejection purposes. When the die is closed the slug or piece of metal 57 which was removed from the panel is centered within the die. Bolts 15, 17 and 19 are then withdrawn, the two members 11 and 13 separated, and thereafter bolts 53 and 55 may be screwed inwardly engaging the slug 57 to force it toward the now opened end of die 13. After a slug is ejected, bolts 53 and 55 are again withdrawn sufficiently to clear any new slug that may be cut from a panel.

The three bolts 15, 17 and 19 which function to align as well as to engage the punch and die members all pass through holes in the punch member 13 which extend through the columnar punch portion 23 and all three threadedly engage the bottom portion 21 of the die 13 as shown in FIG. 2. In FIG. 6, however, three similar bolts 59, 61 and 63 having an analogous function have only the central bolt 61 passing through a columnar punch portion 65 and threadedly engaging a cavity bottom portion of die 67 while the outer two bolts 59 and 63 engage the die 67 in regions laterally adjacent the cavity 69 on opposite sides thereof. These laterally outward bolts 59 and 63 of course pass through holes in the punch flange 71, but again, are outward of the punch columnar portion 65. This variation is for punching holes in panels of lesser eccentricity to accommodate electrical components such as D sub-miniature connectors having a fewer number of individual connecting pins. With this smaller punch, three holes are again drilled in the panel for receiving the three bolts 59, 61 and 63, however, the outer two of these holes are the holes to subsequently be used for connector mounting screws. Hence, the flange 71 of FIG. 6 does not include the dimpling or marking set screws analogous to 37 and 39 in FIG. 2. Thus, with the punch of FIG. 6, only the central one of the three drilled holes is located within the trapezoidal panel region to be removed while with the embodiment illustrated in FIGS. 1 through 3, all three holes are drilled within the trapezoidal panel region 47.

As shown in FIG. 5, the outline of the area 47 to be punched out of sheet metal panel 73 is substantially identical to the configuration of the cavity 45 in die 13. From FIGS. 3 and 5, this hole configuration is seen to be generally trapezoidal with parallel sides 75 and 77, sloped or converging sides 79 and 81 and respective corner fillets such as 83. Such a trapezoidal configuration has a single line of symmetry lying vertically in the plane of the paper and bisecting the area 47, as shown at 76. The complete process of forming such openings will now be readily understood.

As an initial or preliminary step, after selecting the location at which the connector is to be mounted, the panel is marked for the drilling of the three initial holes 85, 87 and 89 as illustrated in FIG. 4. This initial marking may be by an adhesive backed template if desired. After the holes 85, 87 and 89 are drilled at the template marked locations, punch 11 is positioned on one side of the panel and die 13 positioned on the other side of the panel with the punch portion 23 pointing toward the die cavity 45 and these two portions are then threadedly coupled together by passing the bolts 15, 17 and 19 first through the punch 11, then through the holes in panel 73 and finally into the threaded openings 91, 93 and 95 in bottom portion 21 of the die. These three bolts are tightened finger tight and then the tightening of the central bolt 17, as by an Allen wrench, is commenced to cut the desired opening. In the event that the material is particularly difficult to cut or if the punch should become somewhat misaligned relative to the die, one or both of the bolts 15 or 19 may be tightened somewhat to realign the punch and die; tightening of the three bolts may be made sequentially in increments to cut through particularly heavy material. When the cutting operation is complete, removed slug 57 will be approximately in the position illustrated in FIG. 2. The dimpling or drilling points 41 and 43 may be accomplished by slight tightening of the set screws 37 and 39. Bolts 15, 17 and 19 are then withdrawn completely from their respective threaded openings 91, 93 and 95 and the punch and die halves separated from one another and from panel 73. Slug 57 may then be ejected from the die cavity 45 by simply tightening one or both of the slug-ejecting bolts 53 and 55 whereupon these two bolts should be withdrawn somewhat to ready the draw punch cutter for subsequent use. Operation of the draw punch cutter of FIG. 6 is substantially the same and one or two threaded bolts may be provided in the base of cavity 69 for slug ejection purposes.

From the foregoing, it is now apparent that a novel draw punch cutter as well as a novel method of cutting a panel hole have been disclosed meeting the objects and advantageous features set out hereinbefore as well as others. The trapezoidal hole formed by the punch is exemplary of a wide variety of elongated or otherwise irregular holes amenable to the techniques of the present invention. The terms bolt and screws as used herein is intended to cover any of a wide variety of threaded fastening devices suitable for aligning the punch and die, tightening the two together, dimpling or marking the panel and ejecting the slug. Other modification as to the precise configuration, shapes and details may be made by those having ordinary skill in the art without departing from the spirit of the invention or the scope thereof as set out by the claims which follow.

What is claimed is:

1. The method of cutting a hole having at most one line of symmetry in a panel comprising the steps of:
   drilling a plurality of holes in the panel;
   locating a punch on one side of the panel and a die on the other side of the panel;
   threadedly coupling the punch and die together by a plurality of bolts passing through respective drilled panel holes;
   tightening at least one of the bolts to draw the punch and die toward one another to cut the hole in the panel, and
   tightening a pair of screws passing through one of the punch and die and having pointed leading ends to mark the panel for a subsequent further drilling operation.

2. The method of claim 1 wherein the hole to be cut is of a generally trapezoidal shape having respective corner fillets and the plurality of holes are drilled with at least one thereof being located centrally within the trapezoidal panel region to be removed.

3. The method of claim 1 including the preliminary step of template-marking the panel to determine hole-drilling locations.

4. The method of claim 1 including the subsequent step of ejecting from the die the material cut from the panel by threadedly moving at least one bolt into the die to displace the panel material therefrom.

5. The method of claim 1 wherein the hole to be cut is to have exactly one line of symmetry, the method including the preliminary step of locating the positions for drilling the plurality of holes along a straight line generally perpendicular to the line of symmetry.

6. A draw punch cutter for providing a hole in a panel comprising mateable punch and die members movable along an axis into an engagement to cut the hole in an intervening panel, the members including a plurality of parallel pairs of axially aligned holes with one of each pair in one member being threaded to receive a bolt passing through the other of the pair in the other member for maintaining the member in alignment and for forcing the members together into engagement when the bolts are tightened, the punch including a columnar punch portion with a flange portion at one end thereof extending laterally beyond the columnar portion and threadedly receiving a pair of screws having pointed leading ends for marking a panel for a subsequent drilling operation.

7. The cutter of claim 6 wherein the end of the columnar portion opposite the flange portion is formed as a pair of planar surfaces each inclined to the axis of motion and meeting along a line about midway between the columnar edges whereby the planar surfaces are readily accessible for grinding to resharpen the punch.

8. The cutter of claim 7 wherein said pair of planar surfaces are each inclined to the axis of motion.

9. The cutter of claim 6 wherein the punch includes a columnar punch portion having a generally trapezoidal cross-section with rounded corners and the die includes a cavity of uniform like cross-sectional configuration.

10. The cutter of claim 9 wherein the die cavity terminates in a generally planar bottom portion and further comprising three mutually parallel bolts passing through respective holes in the columnar punch and threadedly engaging the cavity bottom portion.

11. The cutter of claim 10 wherein the cavity bottom portion includes a pair of additional threaded holes for receiving slug ejecting bolts.

12. The cutter of claim 9 wherein the die cavity terminates in a generally planar bottom portion, said bottom portion including a pair of threaded holes for receiving slug ejecting bolts.

13. The cutter of claim 9 wherein the die cavity terminates in a generally planar bottom portion and the punch includes a flange portion at one end of the columnar portion, the cutter further comprising three mutually parallel bolts passing through the punch and threadedly engaging the die.

14. The cutter of claim 13 wherein one bolt passes through a hole in the columnar portion and threadedly engages the cavity bottom portion.

15. The cutter of claim 14 wherein two bolts pass through the flange portion and threadedly engage the die in regions laterally adjacent the cavity and on opposite sides thereof.

16. The cutter of claim 6 wherein the columnar portion is mateable with a die cavity in the die member.

17. The cutter of claim 16 wherein said columnar portion has a cutting edge formed as a pair of planar surfaces respectively inclined to the axis of movement and joining along a transverse line generally midway of said columnar portion.

18. The cutter of claim 16 wherein the die cavity has a bottom portion, there being at least two of said holes extending through said columnar portion and said cutting edge thereof respectively on either side of said line and parallel with the axis of movement, said at least two holes being respectively axially lined with two threaded holes in said bottom portion, said bolts passing through said punch portion holes and said die cavity being threaded into said holes and said bottom portion.

19. The cutter of claim 18 wherein said die member has at least an additional threaded hole extending through said bottom portion intermediate said two threaded holes, and further comprising a slug-ejecting bolt threaded through said additional hole and into said die cavity.

* * * * *